(12) United States Patent
Lin et al.

(10) Patent No.: US 10,629,605 B2
(45) Date of Patent: Apr. 21, 2020

(54) SEMICONDUCTOR DEVICE AND METHOD OF MANUFACTURING

(71) Applicant: Taiwan Semiconductor Manufacturing Co., Ltd., Hsin-Chu (TW)

(72) Inventors: Josh Lin, Tainan (TW); Chia-Ta Hsieh, Tainan (TW); Chen-Ming Huang, Tainan (TW); Chi-Wei Ho, Tainan (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 16/202,602

(22) Filed: Nov. 28, 2018

(65) Prior Publication Data

US 2019/0109146 A1 Apr. 11, 2019

Related U.S. Application Data

(62) Division of application No. 15/694,393, filed on Sep. 1, 2017, now Pat. No. 10,263,004.

(Continued)

(51) Int. Cl.
*H01L 27/11521* (2017.01)
*H01L 29/423* (2006.01)
(Continued)

(52) U.S. Cl.
CPC .. *H01L 27/11521* (2013.01); *H01L 21/76802* (2013.01); *H01L 21/76829* (2013.01);
(Continued)

(58) Field of Classification Search
CPC ......... H01L 27/11521; H01L 27/11526; H01L 21/76802; H01L 21/76829;
(Continued)

(56) References Cited

U.S. PATENT DOCUMENTS 6,069,037 A 5/2000 Liao
6,136,677 A 10/2000 Prein
(Continued)

FOREIGN PATENT DOCUMENTS

CN 102543878 A 7/2012
TW 498493 B 8/2002
TW 589715 B 6/2004

OTHER PUBLICATIONS

Non-Final Office Action dated Jun. 15, 2018 for U.S. Appl. No. 15/694,393.

*Primary Examiner* — Tu-Tu V Ho
(74) *Attorney, Agent, or Firm* — Eschweiler & Potashnik, LLC

(57) ABSTRACT

The present disclosure, in some embodiments, relates to an integrated chip. The integrated chip includes a first gate disposed over a substrate and having a first height measured between an upper surface of the substrate and a first uppermost surface of the first gate structure. A second gate structure is disposed over the substrate and has a second height measured between the upper surface of the substrate and a second uppermost surface of the second gate structure. The second height is smaller than the first height. A first sidewall spacer laterally surrounds the first gate structure and is recessed below the first uppermost surface. A second sidewall spacer laterally surrounds the second gate structure. A top of the first sidewall spacer is arranged along a horizontal plane that is vertically between the first uppermost surface and the second uppermost surface.

20 Claims, 7 Drawing Sheets

Related U.S. Application Data

(60) Provisional application No. 62/539,601, filed on Aug. 1, 2017.

(51) Int. Cl.
- *H01L 27/11526* (2017.01)
- *H01L 29/66* (2006.01)
- *H01L 21/768* (2006.01)
- *H01L 27/11519* (2017.01)
- *H01L 27/11531* (2017.01)
- *H01L 23/485* (2006.01)

(52) U.S. Cl.
CPC .. *H01L 21/76877* (2013.01); *H01L 27/11519* (2013.01); *H01L 27/11526* (2013.01); *H01L 27/11531* (2013.01); *H01L 29/42324* (2013.01); *H01L 29/6653* (2013.01); *H01L 23/485* (2013.01); *H01L 29/6656* (2013.01)

(58) Field of Classification Search
CPC ......... H01L 21/76877; H01L 29/42324; H01L 29/6653; H01L 29/6656
USPC ....................................................... 257/316
See application file for complete search history.

(56) References Cited

U.S. PATENT DOCUMENTS

| | | |
|---|---|---|
| 6,333,219 B1 | 12/2001 | Park et al. |
| 2002/0024093 A1 | 2/2002 | Am et al. |
| 2002/0033495 A1 | 3/2002 | Kim |
| 2004/0058522 A1 | 3/2004 | Lee et al. |
| 2006/0284229 A1 | 12/2006 | Park |
| 2007/0037336 A1 | 2/2007 | Kwon et al. |
| 2007/0190720 A1 | 8/2007 | Li et al. |
| 2007/0281424 A1 | 12/2007 | Kim et al. |
| 2011/0159677 A1 | 6/2011 | Lee |
| 2013/0230952 A1 | 9/2013 | Wang et al. |
| 2013/0248948 A1* | 9/2013 | Ma ................... H01L 29/66636 257/288 |
| 2014/0167055 A1 | 6/2014 | Gridelet et al. |
| 2015/0228754 A1 | 8/2015 | Sung |
| 2017/0179142 A1 | 6/2017 | Zhang et al. |
| 2018/0277430 A1* | 9/2018 | Xie .................. H01L 21/76879 |

\* cited by examiner

SEMICONDUCTOR DEVICE AND METHOD OF MANUFACTURING

REFERENCE TO RELATED APPLICATIONS

This Application is a Divisional of U.S. application Ser. No. 15/694,393, filed on Sep. 1, 2017, which claims priority to U.S. Provisional Application No. 62/539,601, filed on Aug. 1, 2017. The contents of the above-referenced Patent Applications are hereby incorporated by reference in their entirety.

BACKGROUND

To improve the functionality of integrated chips, the semiconductor industry has continually increased the number of transistors that are on an integrated chip. To achieve a larger number of transistors on an integrated chip, without substantially increasing a size of the integrated chip, the semiconductor industry has had to also continually reduce the minimum feature size of integrated chip components. For example, the minimum gate width of a transistor has been reduced from tens of microns in the 1980s to tens of nanometers advanced technology nodes (e.g., in 22 nm nodes, 16 nm nodes, etc.).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
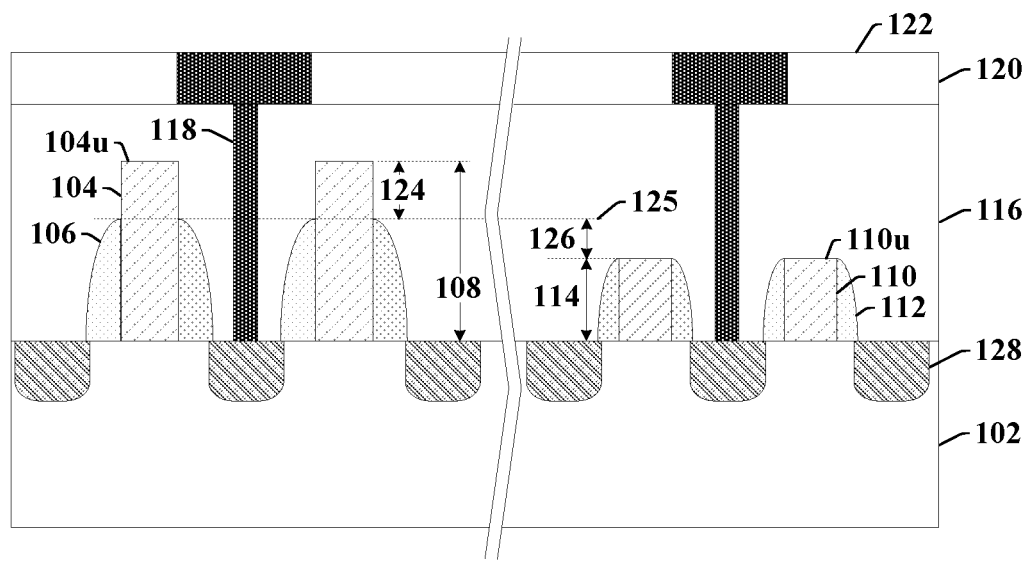
FIG. 1 illustrates a cross-sectional view of some embodiments of an integrated chip having sidewall spacers configured to improve dielectric fill between adjacent gate structures.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In recent years, the continual reduction of integrated chip minimum feature sizes has made many processes of semiconductor fabrication more difficult. For example, as a minimum gate pitch has decreased the space between adjacent gate structures has also decreased. In many modern day integrated chips the space between adjacent gate structures has decreased so that it is smaller than heights of the gate structures, resulting in a high aspect ratio trench between the adjacent gate structures. The high aspect ratio trench is difficult to fill with a dielectric material without generating defects (e.g., voids) in the dielectric material.

Such defects can have a detrimental effect on integrated chips. For example, to form a conductive contact on source/drain regions, the dielectric material between adjacent gate structures is etched to form a contact hole, and a conductive material is formed within the contact hole. However, if voids are present in the dielectric material, the voids may be filled with the conductive material during formation of the conductive contacts. If the voids are filled with the conductive material, a distance between the conductive material and the surrounding gate structures is reduced. Reducing a distance between the conductive material and the surrounding gate structures reduces a thickness of the dielectric material between the conductive material and the gate structures and therefore can lead to a higher rate of time dependent dielectric breakdown (TDDB) and device failure.

The present disclosure, in various embodiments, relates to a method of forming sidewall spacers configured to improve dielectric fill between adjacent gate structures, and an associated apparatus. In some embodiments, the method comprises depositing a sidewall spacer material over a first and second plurality of gate structures. A first etching process is performed on the sidewall spacer material to form a first plurality of intermediate sidewall spacers surrounding the first plurality of gate structures and a second plurality of sidewall spacers surrounding the second plurality of gate structures. A masking material is formed over the substrate. Parts of the first plurality of intermediate sidewall spacers protrude outward from the masking material, while the second plurality of sidewall spacers are completely covered by the masking material. A second etching process is then performed on the parts of the first plurality of intermediate sidewall spacers protruding outward from the masking material to form a first plurality of sidewall spacers recessed below uppermost surfaces of the first plurality of gate structures. Recessing the first plurality of sidewall spacers below uppermost surfaces of the first plurality of gate structures makes it easier to form a dielectric material between adjacent ones of the first plurality of gate structures without forming defects in the dielectric material.

FIG. 1 illustrates a cross-sectional view of some embodiments of an integrated chip 100 having sidewall spacers configured to improve dielectric fill between adjacent gate structures.

The integrated chip 100 comprises a first plurality of gate structures 104 and a second plurality of gate structures 110 arranged over a substrate 102. The first plurality of gate structures 104 have a first height 108 extending between the substrate 102 and uppermost surfaces 104u of the first plurality of gate structures 104. The second plurality of gate structures have a second height 114 extending between the substrate 102 and uppermost surfaces 110u of the second plurality of gate structures 110. The second height 114 is smaller than the first height 108. Because the second height 114 is smaller than the first height 108, uppermost surfaces 110u of the second plurality of gate structures 110 are separated from the substrate 102 by a smaller distance than uppermost surfaces 104u of the first plurality of gate structures 104.

The first plurality of gate structures 104 are surrounded by a first plurality of sidewall spacers 106 having outermost sidewalls that are laterally separated from one another. In some embodiments, the first plurality of sidewall spacers 106 contact sidewalls of the first plurality of gate structures 104. The first plurality of sidewall spacers 106 extend along sides of the first plurality of gate structures 104 to a height that is recessed below the uppermost surfaces 104u of the first plurality of gate structures 104 by a first distance 124. In some embodiments, tops of the first plurality of sidewall spacers 106 are arranged along one or more horizontal planes 125 that are vertically between the uppermost surfaces 104u of the first plurality of gate structures 104 and the uppermost surfaces 110u of the second plurality of gate structures 110. For example, the one or more horizontal planes 125 may be the first distance 124 below the uppermost surfaces 104u of the first plurality of gate structures 104 and a second distance 126 above the uppermost surfaces 110u of the second plurality of gate structures 110.

The second plurality of gate structures 110 are surrounded by a second plurality of sidewall spacers 112 that are laterally separated from one another. In some embodiments, the second plurality of sidewall spacers 112 contact sidewalls of the second plurality of gate structures 110. The second plurality of sidewall spacers 112 are recessed below uppermost surfaces 110u of the second plurality of gate structures 110 by a second distance that is smaller than the first distance 124. In some embodiments, the second plurality of sidewall spacers 112 are recessed below uppermost surfaces 110u of the second plurality of gate structures 110 by a second distance that is approximately equal to zero. In such embodiments, the second plurality of sidewall spacers 112 extend along sides of the second plurality of gate structures 110 to a height that is substantially equal the second height 114 of the second plurality of gate structures 110.

A dielectric structure is arranged over the substrate 102. The dielectric structure comprises a first inter-level dielectric (ILD) layer 116 over the substrate 102 and a second ILD layer 120 over the first ILD layer 116. The first ILD layer 116 surrounds the first plurality of gate structures 104 and the second plurality of gate structures 110, while the second ILD layer 120 surrounds a plurality of metal interconnect wires 122. In some embodiments, conductive contacts 118 extend through the first ILD layer 116, from the plurality of metal interconnect wires 122 to source/drain regions 128 between adjacent ones of the first plurality of gate structures 104 and between adjacent ones of the second plurality of gate structures 110.

Because the first plurality of sidewall spacers 106 are recessed below uppermost surfaces 104u of the first plurality of gate structures 104, the first ILD layer 116 is able to fill areas between adjacent ones of the first plurality of gate structures 104 while mitigating void formation within the first ILD layer 116. Mitigating void formation within the first ILD layer 116 improves electrical isolation between the conductive contacts 118 and the first plurality of gate structures 104 and therefore improves reliability (e.g., mitigates TDDB) of the integrated chip 100.

Figure 2:
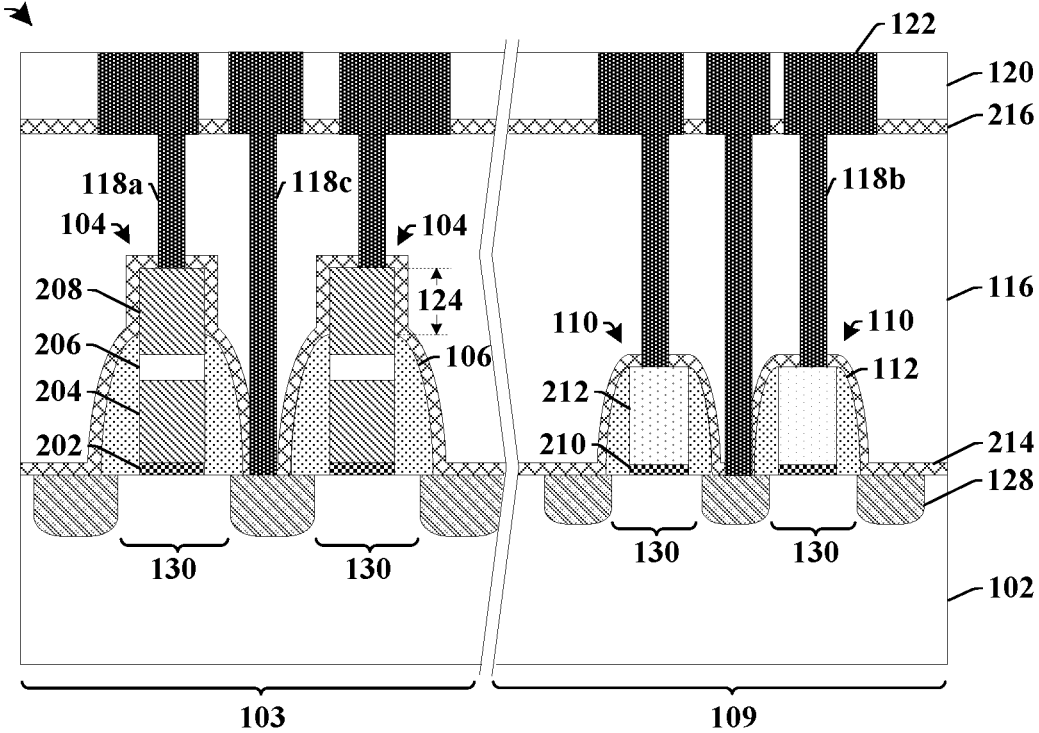
FIG. 2 illustrates a cross-sectional view of some additional embodiments of an integrated chip having sidewall spacers configured to improve dielectric fill between adjacent gate structures.

FIG. 2 illustrates a cross-sectional view of some additional embodiments of an integrated chip 200 having sidewall spacers configured to improve dielectric fill between adjacent gate structures.

The integrated chip 200 comprises a first plurality of gate structures 104 and a second plurality of gate structures 110 arranged over a substrate 102. The first plurality of gate structures 104 and the second plurality of gate structures 110 are arranged over channel regions 130 extending between source/drain regions 128 within the substrate 102. The first plurality of gate structures 104 may have a first height and the second plurality of gate structures 110 may have a smaller, second height. In some embodiments, the first plurality of gate structures 104 may comprise flash memory gate structures arranged within an embedded memory region 103 of the substrate 102 and the second plurality of gate structures 110 may comprise logic gate structures arranged within a logic region 109 of the substrate 102.

In such embodiments, the first plurality of gate structures 104 comprise a tunnel dielectric 202 over the substrate 102, a floating gate electrode 204 separated from the substrate 102 by the tunnel dielectric 202, an inter-electrode dielectric 206 over the floating gate electrode 204, and a control gate electrode 208 over the inter-electrode dielectric 206. Because the floating gate electrode 204 is electrically isolated from an underlying one of the channel regions 130 by the tunnel dielectric 202, charges may be trapped on it. The trapped charges are indicative of a data state stored by the floating gate electrode 204. For example, in order to read a memory cell, a voltage is applied to the control gate electrode 208. Since a conductivity of the underlying one of the channel regions 130 is influenced by charges on the floating gate electrode 204, a current flow through the channel region can be measured and used to determine a stored data state.

In some embodiments, the tunnel dielectric 202 may comprise a dielectric material such as an oxide (e.g., silicon dioxide), a nitride, or the like. In some embodiments, the floating gate electrode 204 and the control gate electrode 208 may comprise polysilicon or the like. In some embodiments, the inter-electrode dielectric 206 may comprise a stacked layer comprising a nitride layer disposed between oxide layers (i.e., an 'ONO' layer). In other embodiments, the inter-electrode dielectric 206 may comprise a different stacked layers, such as silicon dots arranged between dielectric layers, or the like.

A first plurality of sidewall spacers 106 are disposed along sides of the first plurality of gate structures 104. The first plurality of sidewall spacers 106 are recessed below uppermost surfaces of the first plurality of gate structures 104 by a first distance 124. In some embodiments, the first distance 124 may be in a range of between approximately 5 nanometers (nm) and approximately 25 nm. In some additional embodiments, the first distance 124 may be in a range of between approximately 10 nm and approximately 20 nm. In some embodiments, the first plurality of sidewall spacers 106 extend along the first plurality of gate structures 104 to positions between uppermost surfaces of the inter-electrode dielectric 206 and the control gate electrode 208, so that the control gate electrode 208 protrudes outward from between interior sidewalls of the first plurality of sidewall spacers 106.

The second plurality of gate structures 110 comprise a gate dielectric 210 arranged over the substrate 102 and a gate electrode 212 separated from the substrate 102 by the gate dielectric 210. A second plurality of sidewall spacers 112 are arranged along the second plurality of gate structures 110. In some embodiments, the second plurality of sidewall spacers 112 extend along the second plurality of gate structures 110 to positions substantially aligned with uppermost surfaces of the gate electrode 212. In some embodiments, the gate electrode 212 may comprise polysilicon and the gate dielectric 210 may comprise a dielectric (e.g., an oxide, a nitride, or the like). In other embodiments, the gate electrode 212 may comprise a metal (e.g., aluminum, platinum, ruthenium, or the like.) and the gate dielectric 210 may comprise a high-k dielectric material (e.g., hafnium dioxide ($HfO_2$), zirconium dioxide ($ZrO_2$) and titanium dioxide ($TiO_2$), or the like). In some embodiments, the first and second plurality of sidewall spacers, 106 and 112, may comprise a same material. For example, the first and second plurality of sidewall spacers, 106 and 112, may comprise an oxide (e.g., silicon dioxide, etc.), a nitride (e.g., silicon nitride, silicon oxy-nitride, etc.), or the like.

A contact etch stop layer (CESL) 214 is disposed over the substrate 102, and a first inter-level dielectric (ILD) layer 116 is over the CESL 214. In some embodiments, the CESL 214 contacts sidewalls of the first plurality of gate structures 104 and the first plurality of sidewall spacers 106. A plurality of conductive contacts 118a-118c are arranged within the first ILD layer 116. The plurality of conductive contacts 118a-118c comprise first conductive contacts 118a that extend to the control gate electrodes 208 and second conductive contacts 118b that extend to the gate electrodes 212. The plurality of conductive contacts 118a-118c further comprise third conductive contacts 118c that extend between adjacent ones of the first plurality of gate structures 104 and between adjacent ones of the second plurality of gate structures 110 to the source/drain regions 128 within the substrate 102. An additional etch stop layer 216 separates the first ILD layer 116 from a second ILD layer 120 over the first ILD layer 116. One or more metal interconnect wires 122 are arranged within the second ILD layer 120.

Although FIG. 2 illustrates the first plurality of gate structures 104 and the second plurality of gate structures 110 as having a specified layers and/or shapes, it will be appreciated that the first plurality of gate structures 104 and the second plurality of gate structures 110 are not limited to the structures illustrated in FIG. 2. Rather, in alternative embodiments, the first plurality of gate structures 104 and the second plurality of gate structures 110 may have different shapes and/or may have additional layers or fewer layers. For example, in some embodiments, the first plurality of gate structures 104 and the second plurality of gate structures 110 may both be logic gate structures having different heights due to different thicknesses of the gate dielectric layers, gate electrodes, and/or hard masks (e.g., the first plurality of gate structures 104 may be associated with high voltage transistors and the second plurality of gate structures 110 may be associated with lower voltage transistors that have thinner gate dielectrics).

Figure 3A:
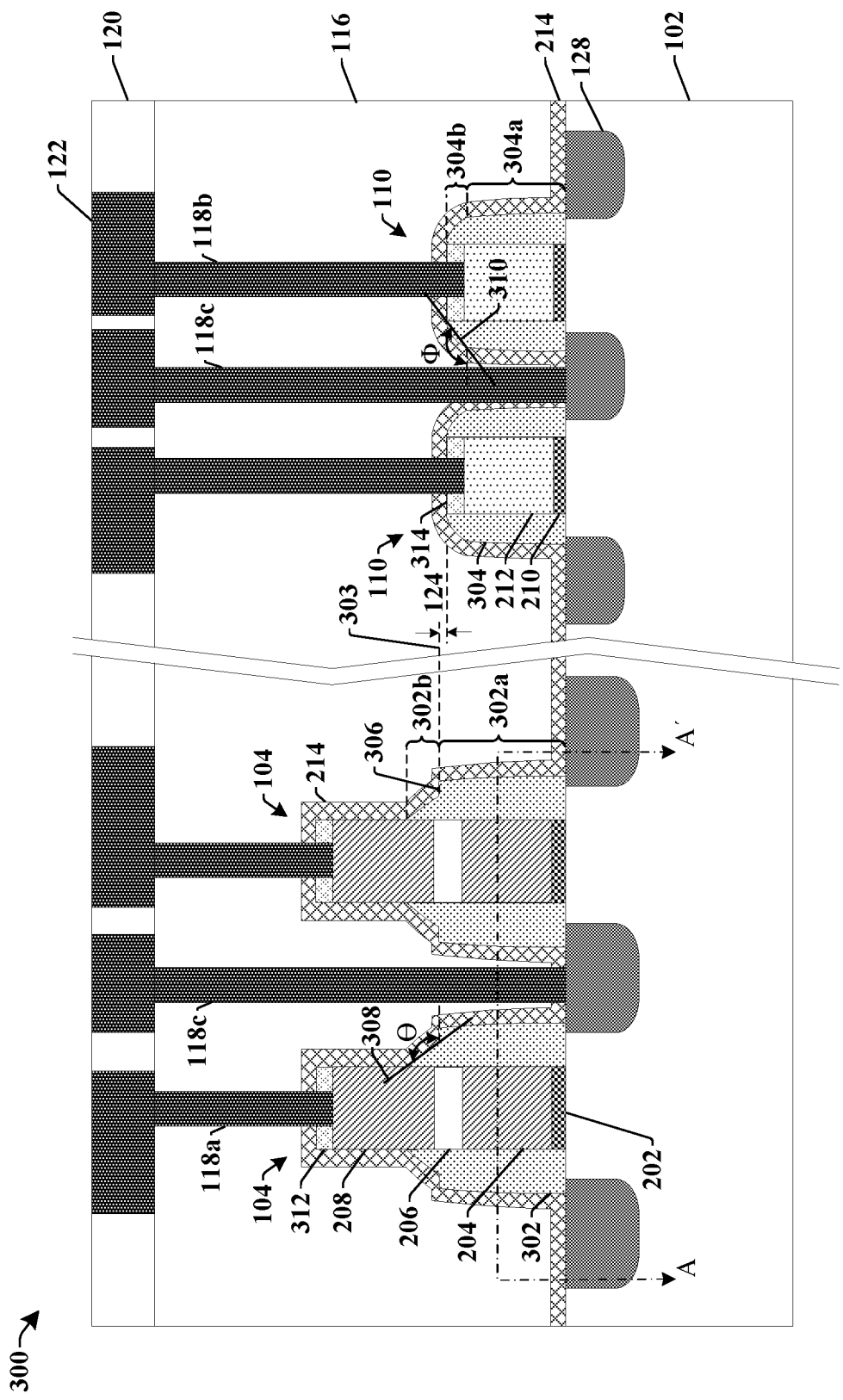
FIGS. 3A-3B illustrate some additional embodiments of an integrated chip having sidewall spacers configured to improve dielectric fill between adjacent gate structures.
Figure 3B:
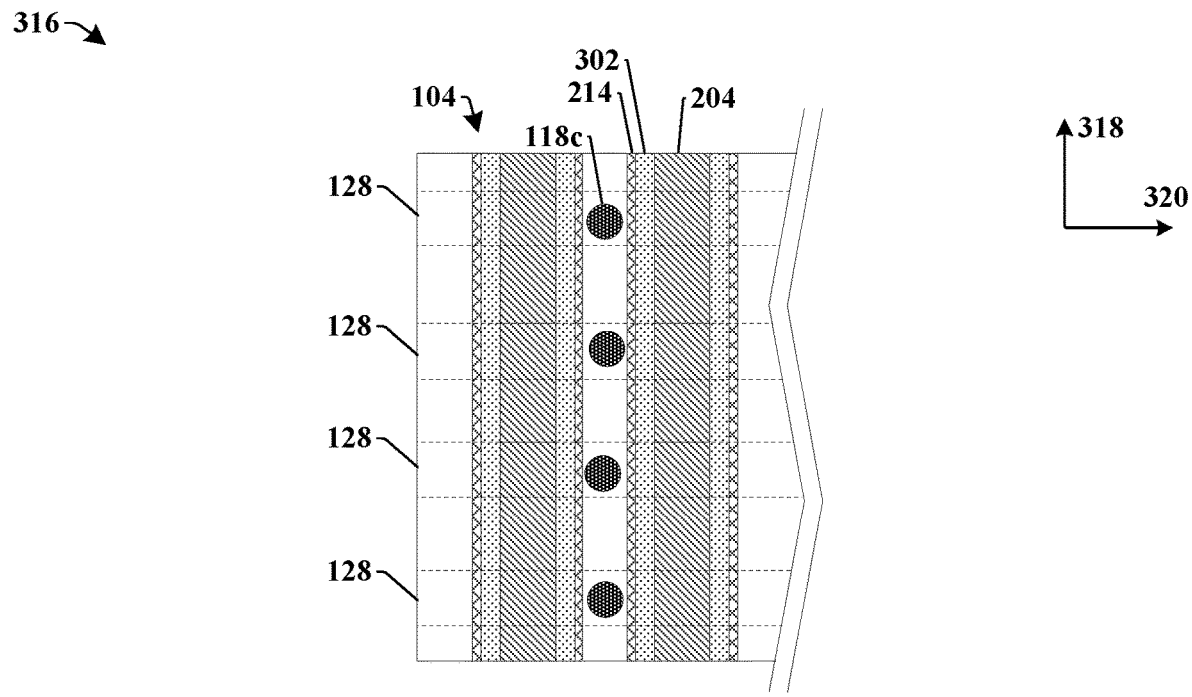

FIGS. 3A-3B illustrate some additional embodiments of an integrated chip having sidewall spacers configured to improve dielectric fill between adjacent gate structures.

As shown in cross-sectional view 300 of FIG. 3A, the integrated chip comprises a first plurality of gate structures 104 having a first height and a second plurality of gate structures 110 having a second height less than the first height.

A first plurality of sidewall spacers 302 (e.g., corresponding to the first plurality of sidewall spacers 106) surround the first plurality of gate structures 104, and a second plurality of sidewall spacers 304 (e.g., corresponding to the second plurality of sidewall spacers 112) surround the second plurality of gate structures 110. In some embodiments, the first plurality of sidewall spacers 302 may have a first lower region 302a and a first upper region 302b over the first lower region 302a. The second plurality of sidewall spacers 304 may have a second lower region 304a and a second upper region 304b over the second lower region 304a. The first upper region 302b and the second upper region 304b have angled outer sidewalls that respectively cause widths of the first plurality of sidewall spacers 302 and the second plurality of sidewall spacers 304 to monotonically decrease over heights of the first upper region 302b and the second upper region 304b, respectively.

The first lower region 302a and the first upper region 302b meet along a horizontal plane 303 that is over uppermost surfaces of the second plurality of gate structures 110. In some embodiments, the sidewalls of the first lower region 302a and the first upper region 302b may be connected by a ledge 306. In other embodiments, the sidewalls of the first lower region 302a and the first upper region 302b may be directly connected.

The first plurality of sidewall spacers 302 have a first cross-sectional profile that has a different shape and size than a second cross-sectional profile of the second plurality of sidewall spacers 304. For example, in some embodiments, a first line 308 extending between ends of a sidewall of the first upper region 302b may have a first slope that is larger than a slope of a second line 310 extending between ends of a sidewall of the second upper region 304b. In some embodiments, an angular difference ⊖ between the first line 308 and a horizontal line may be in a range of between approximately 55° and approximately 65°, while an angular difference ϕ between the second line 310 and a horizontal line may be in a range of between approximately 45° and approximately 50°. In some additional embodiments, a sidewall of the first upper region 302b has a smaller curvature than a sidewall of the second upper region 304b. For example, the sidewall of the first upper region 302b has a first deviation from the first line 308 that is smaller than a second deviation of the sidewall of the second upper region 304b from the second line 310.

In some embodiments, the sidewall of the first upper region 302b has a linear segment extending along a non-zero distance of the sidewall. The linear segment and relatively large slope of the sidewall of the first upper region 302b causes the first plurality of sidewall spacers 302 to define an opening comprising a 'V' shape between adjacent ones of the first plurality of gate structures 104. The 'V' shape of the opening reduces an aspect ratio of a gap between adjacent ones of the first plurality of sidewall spacers 302, and therefore gives the first plurality of sidewall spacers 302 a geometry that enables easier filling of the gap.

In some embodiments, the first upper region 302b has a height (in a direction perpendicular to an upper surface of the substrate 102) that is larger than a height of the second upper region 304b. In some embodiments, the height of the first upper region 302b is a larger portion of a height of the first plurality of sidewall spacers 302 than the height of the second upper region 304b is a portion of a height of the second plurality of sidewall spacers 304. For example, in some embodiments, the height of the first upper region 302b is between approximately 20% and approximately 35% of a height of the first plurality of sidewall spacers 302, while the height of the second upper region 304b is between approximately 10% and approximately 20% of a height of the second plurality of sidewall spacers 304.

In some embodiment, a first hard mask 312 may be arranged along tops of the first plurality of gate structures 104, and a second hard mask 314 may be arranged along tops of the second plurality of gate structures 110. In such embodiments, a first conductive contact 118a is configured to extend through the first hard mask 312 to the control gate electrode 208 and a second conductive contact 118b is configured to extend through the second hard mask 314 to the control gate electrode 208. In some embodiments, the first hard mask 312 and the second hard mask 314 may comprise a nitride (e.g., silicon nitride, tantalum oxy-nitride, etc.), an oxide (e.g., silicon oxide, silicon oxy-nitride, etc.), a metal (e.g., titanium, titanium nitride, etc.), or the like.

FIG. 3B illustrates a top-view 316 of the integrated chip shown in FIG. 3A along line A-A'. As shown in top-view 316, in some embodiments, the first plurality of gate structures 104 may be oriented along a first direction 318 and separated from one another along a second direction 320 that is perpendicular to the first direction 318. The floating gate electrodes 204 within the first plurality of gate structures 104 extend in the first direction 318 over multiple source/drain regions 128. In some embodiments, the source/drain regions 128 are configured to act as bit-lines while control gate electrodes (208 of FIG. 3A) overlying the floating gate electrodes 204 are configured to act as word-lines. By orienting the first plurality of gate structures 104 along a same direction, lithography techniques can be optimized to result in a smaller distance between adjacent ones of the first plurality of gate structures 104. In some embodiments (not shown), the second plurality of gate structures (110 of FIG. 3A) may be oriented along the first direction 318 also, while in other embodiments the second plurality of gate structures (110 of FIG. 3A) may be oriented along the second direction 320.

FIGS. 4-10 illustrate some embodiments of cross-sectional views 400-1000 showing a method of forming an integrated chip having sidewall spacers configured to improve dielectric fill between adjacent gate structures. Although the cross-sectional views 400-1000 shown in FIGS. 4-10 are described with reference to a method, it will be appreciated that the structures shown in FIGS. 4-10 are not limited to the method but rather may stand alone separate of the method.

Figure 4:
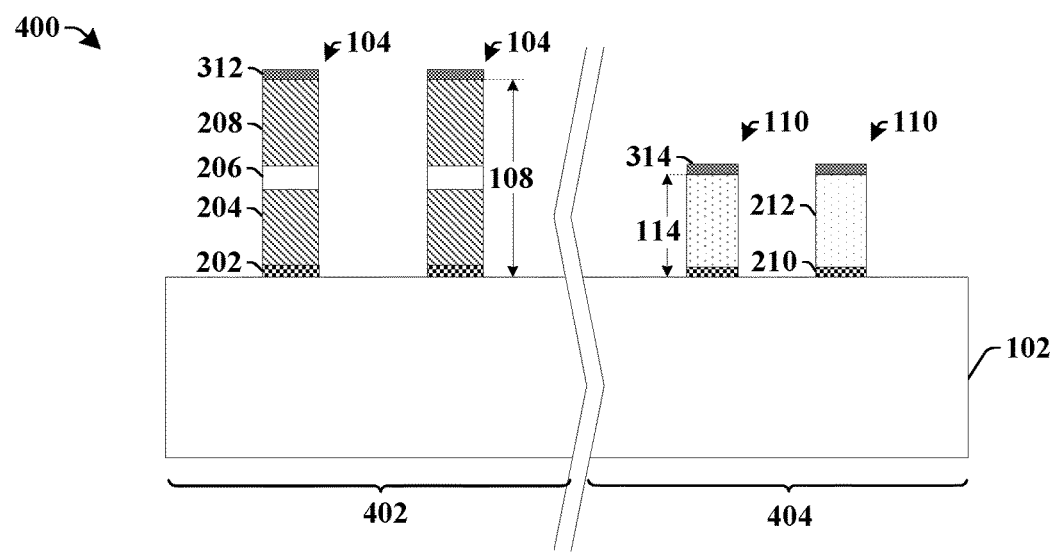
FIGS. 4-10 illustrate some embodiments of cross-sectional views showing a method of forming an integrated chip having sidewall spacers configured to improve dielectric fill between adjacent gate structures.

As shown in cross-sectional view 400 of FIG. 4, a first plurality of gate structures 104 having a first height 108 and a second plurality of gate structures 110 having a second height 114 are formed over a substrate 102. In various embodiments, the substrate 102 may be any type of semiconductor body (e.g., silicon, SiGe, SOI, etc.), such as a semiconductor wafer and/or one or more die on a wafer, as well as any other type of semiconductor and/or epitaxial layers, associated therewith.

In some embodiments, the first plurality of gate structures 104 and the second plurality of gate structures 110 may be formed by separate fabrication processes (e.g., depositions, thermal growth processes, and/or patterning processes). For example, in some embodiments, a first masking layer may be formed over a first region 402 (e.g., corresponding to embedded memory region 103 of FIG. 2) of the substrate 102. A tunnel dielectric film may be subsequently be formed over the substrate 102, a floating gate electrode film may be formed over the tunnel dielectric film, an inter-electrode dielectric film may be formed over the floating gate electrode film, and a control gate electrode film may be formed over the inter-electrode dielectric film. A first patterning process is then performed, which patterns the tunnel dielectric film, the floating gate electrode film, the inter-electrode dielectric film, and the control gate electrode film to form a tunnel dielectric 202, a floating gate electrode 204, an inter-electrode dielectric 206, and a control gate electrode 208. In some embodiments, the first patterning process may be performed according to a first hard mask (not shown) formed over the control gate electrode film.

After the first patterning process is completed, the first masking layer is removed and a second masking layer is formed over a second region 404 (e.g., corresponding to logic region 109 of FIG. 2) of the substrate 102. A gate dielectric film may be subsequently be formed over the substrate 102 and a gate electrode film may be formed over the gate dielectric film. A second patterning process is performed, which patterns the gate dielectric film and the gate electrode film to form a gate dielectric 210 and a gate electrode 212. In some embodiments, the second patterning process may be performed according to a second hard mask (not shown) formed over the gate electrode film.

Figure 5:
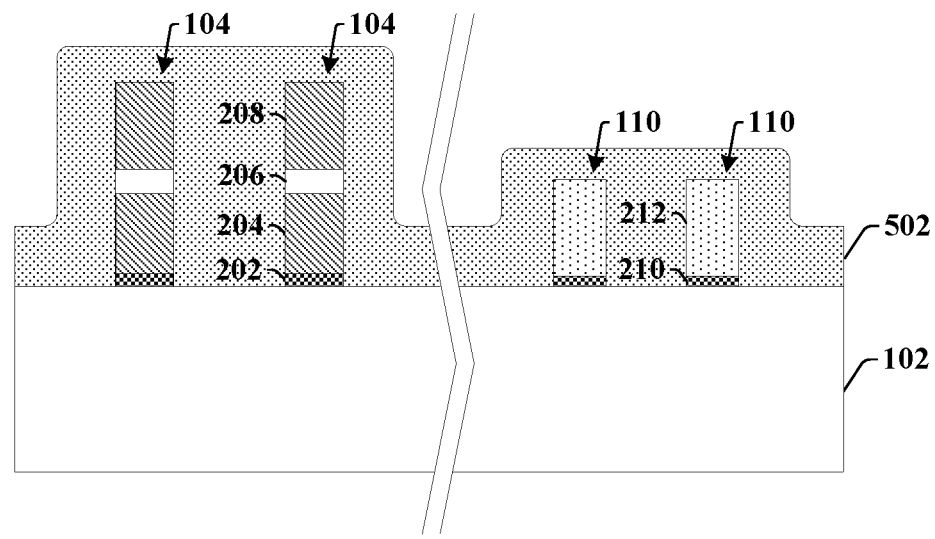

As shown in cross-sectional view 500 of FIG. 5, a sidewall spacer material 502 is formed over the first plurality of gate structures 104 and the second plurality of gate structures 110. The sidewall spacer material 502 continually extends between adjacent ones of the first plurality of gate structures 104 and/or the second plurality of gate structures 110. In some embodiments, the sidewall spacer material 502 may comprise a dielectric material, such as an oxide and/or a nitride (e.g., silicon dioxide, silicon nitride, silicon oxynitride, or the like.). In some embodiments, the sidewall spacer material 502 may be formed by way of a deposition technique (e.g., a chemical vapor deposition (CVD), a physical vapor deposition, a plasma enhanced CVD, etc.).

Figure 6:
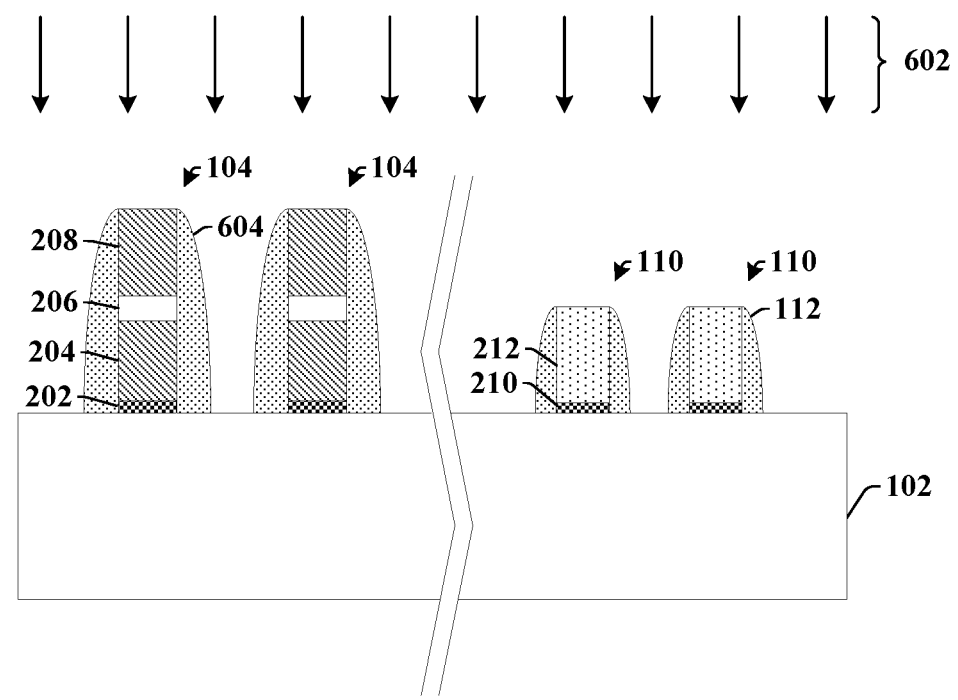

As shown in cross-sectional view 600 of FIG. 6, a first etching process is performed on the sidewall spacer material (502 of FIG. 5) to concurrently form a first plurality of intermediate sidewall spacers 604 and a second plurality of sidewall spacers 112. The first etching process is performed by exposing the sidewall spacer material (502 of FIG. 5) to a first etchant 602. The first etchant 602 removes the sidewall spacer material from horizontal surfaces of the substrate 102, the first plurality of gate structures 104, and the second plurality of gate structures 110. In some embodiments, the first etchant 602 may comprise a dry etchant, such as a plasma etchant (e.g., a reactive ion etchant) or an ion bombardment etchant. In other embodiments, the first etchant 602 may comprise a wet etchant (e.g., hydrofluoric acid (HF), Tetramethylammonium hydroxide (TMAH), potassium hydroxide (KOH), or the like). The first plurality of intermediate sidewall spacers 604 comprise discrete structures arranged along opposing sides of the first plurality of gate structures 104. The second plurality of sidewall spacers 112 comprise discrete structures arranged along opposing sides of the second plurality of gate structures 110.

In some embodiments, the first etching process may over-etch the sidewall spacer material (502 of FIG. 5) resulting in depressions (not shown) within the substrate 102 at locations between adjacent ones of the first plurality of gate structures 104 and/or the second plurality of gate structures 110. For example, the substrate 102 may be recessed to a depth of between approximately 0 nm and approximately 5 nm between adjacent ones of the first plurality of gate structures 104 and between adjacent ones of the second plurality of gate structures 110. In such embodiments, the first plurality of intermediate sidewall spacers 604 may be recessed below uppermost surfaces of the first plurality of gate structures 104 and the second plurality of sidewall spacers 112 may be recessed below uppermost surfaces of the second plurality of gate structures 110.

Figure 7:
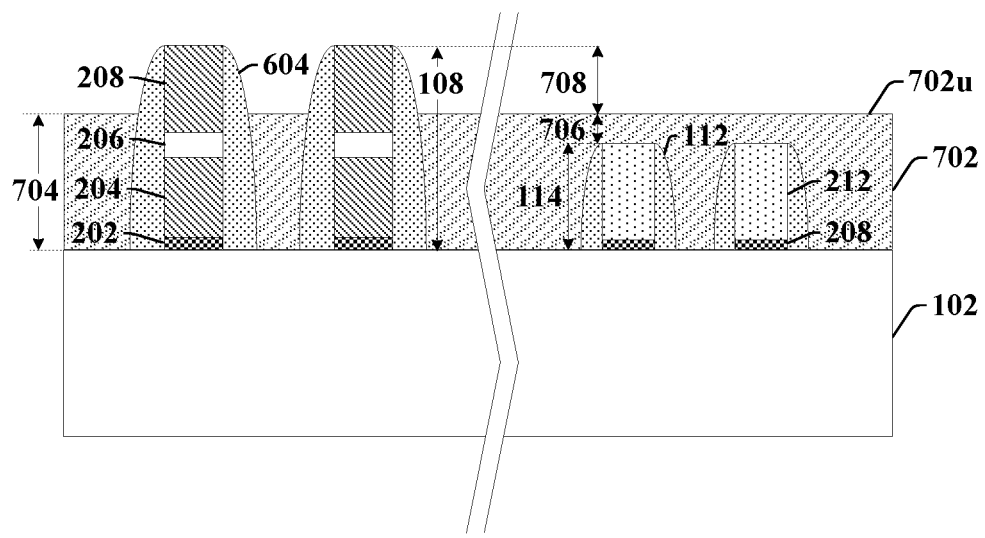

As shown in cross-sectional view 700 of FIG. 7, a masking material 702 is formed over the substrate 102. The masking material 702 extends to a height 704 that is less than the first height 108 and that is greater than the second height 114. Such a height 704 causes the masking material 702 to cover a part, but not all, of the first plurality of intermediate sidewall spacers 604, and to further cover an entirety of the second plurality of sidewall spacers 112. For example, in some embodiments, the masking material 702 has an upper surface 702u that may overlie uppermost surfaces of the second plurality of gate structures 110 by a first distance 706 and be recessed below uppermost surfaces of the first plurality of gate structures 104 by a second distance 708. In some embodiments, the masking material 702 may comprise a photoresist layer. In some embodiments, the photoresist layer may be formed by a spin coating process.

Figure 8:
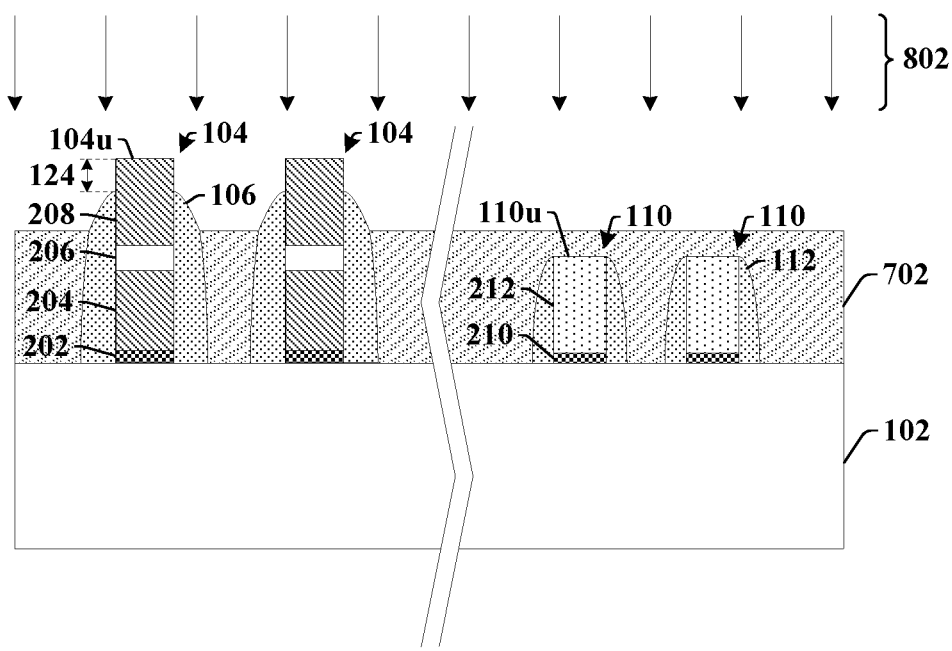

As shown in cross-sectional view 800 of FIG. 8, a second etching process is performed. The second etching process is performed by exposing regions of the first plurality of intermediate sidewall spacers (604 of FIG. 7), which are not covered by the masking material 702, to a second etchant 802. The second etchant 802 etches the first plurality of intermediate sidewall spacers to form a first plurality of sidewall spacers 106 having a height less than the first plurality of intermediate sidewall spacers. The first plurality of sidewall spacers 106 are recessed below uppermost surfaces 104u of the first plurality of gate structures 104 by a first distance 124 that is greater than a distance which the second plurality of sidewall spacers 112 are recessed below uppermost surfaces 110u of the second plurality of gate structures 110.

The second etchant 802 also changes a cross-sectional profile of the first plurality of intermediate sidewall spacers so that the first plurality of sidewall spacers 106 have a cross-sectional profile with a different shape and size than the first plurality of intermediate sidewall spacers. In some embodiments, the second etchant 802 reduces a curvature of the first plurality of intermediate sidewall spacers so that the first plurality of sidewall spacers 106 have sidewalls over the masking material 702 that are more linear than sidewalls of the first plurality of intermediate sidewall spacers over the masking material 702. In some embodiments, the second etchant 802 may comprise a dry etchant (e.g., a plasma etchant, an ion bombardment etchant) and/or a wet etchant (e.g., TMAH, KOH, or the like). After the second etching process is completed, the masking material 702 is removed.

Figure 9:
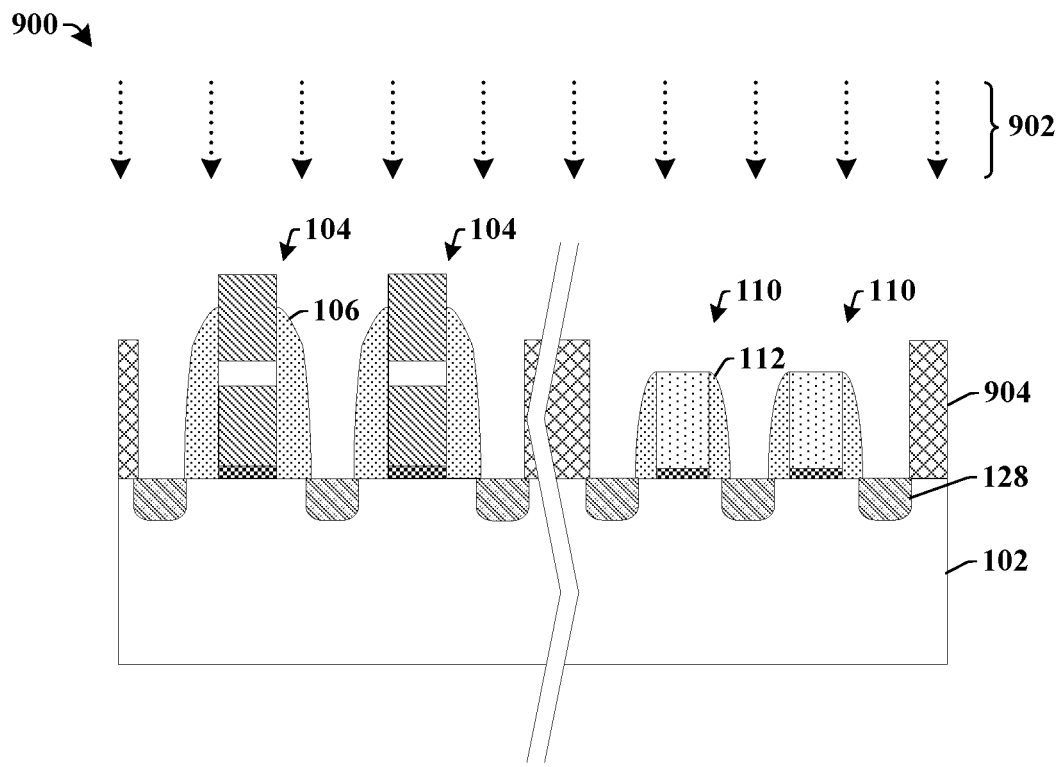

As shown in cross-sectional view 900 of FIG. 9, source/drain regions 128 are formed within the substrate 102 between adjacent ones of the first plurality of gate structures 104 and between adjacent ones of the second plurality of gate structures 110. In some embodiments, the source/drain regions 128 may be formed by selectively implanting a dopant species 902 into the substrate 102. In some embodiments, the dopant species 902 may be selectively implanted into the substrate 102 according to a mask comprising a masking layer 904 (e.g., a photoresist layer). In various embodiments, the dopant species 902 may comprise a p-type dopant (e.g., boron, gallium, or the like) or an n-type dopant (e.g., phosphorus, arsenic, or the like). In some embodiments, after implanting the dopant species 902 into the substrate 102, a drive-in anneal may be performed to diffuse the dopant species within the substrate 102.

Figure 10:
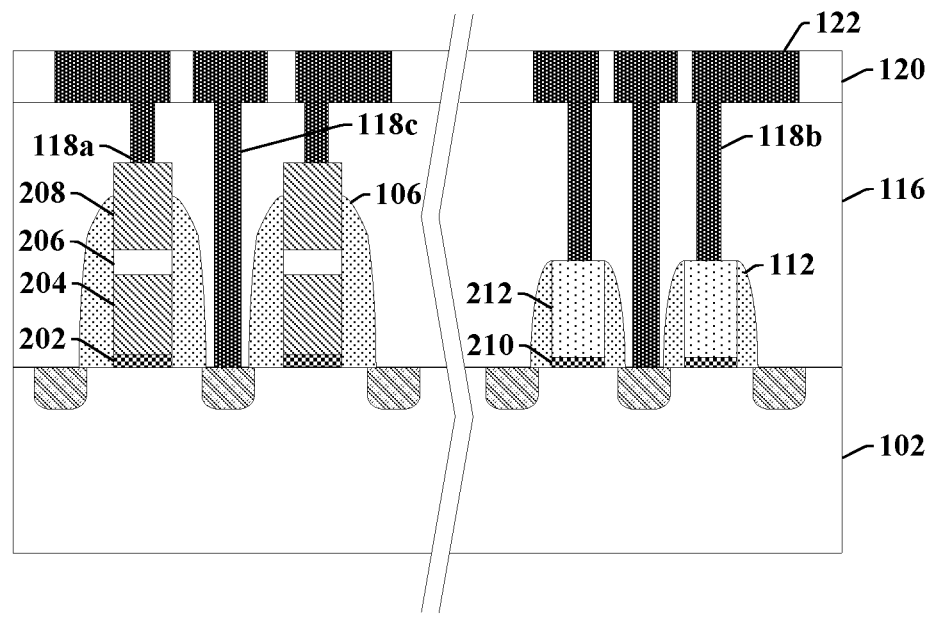

As shown in cross-sectional view 1000 of FIG. 10, one or more interconnect layers, 118 and 122, are formed within ILD layers, 116 and 120, over the substrate 102. The one or more interconnect layers, 118 and 122, comprise a plurality of conductive contacts 118a-118c formed within a first ILD layer 116 over the substrate 102 and a plurality of metal interconnect wires 122 arranged within a second ILD layer 120 over the first ILD layer 116. The plurality of conductive contacts 118a-118c comprise first conductive contacts 118a extending between the control gate electrodes 208 and the plurality of metal interconnect wires 122 and second conductive contacts 118b extending between the gate electrodes 212 and the plurality of metal interconnect wires 122. The plurality of conductive contacts 118a-118c further comprise third conductive contacts 118c that extend between adjacent ones of the first plurality of gate structures 104 and between adjacent ones of the second plurality of gate structures 110 to the source/drain regions 128 within the substrate 102.

In some embodiments, the one or more interconnect layers, 118 and 122, may be formed using a damascene process (e.g., a single damascene process or a dual damascene process). The damascene process is performed by forming an ILD layer over the substrate 102, etching the ILD layer to form a hole and/or a trench, and filling the hole and/or trench with a conductive material. In some embodiments, the ILD layer may be deposited by a vapor deposition technique (e.g., PVD, CVD, PE-CVD, ALD, etc.) and the conductive material may be formed using a deposition process and/or a plating process (e.g., electroplating, electroless plating, etc.). In various embodiments, the one or more interconnect layers, 118 and 122, may comprise tungsten, copper, or aluminum copper, or the like.

Figure 11:
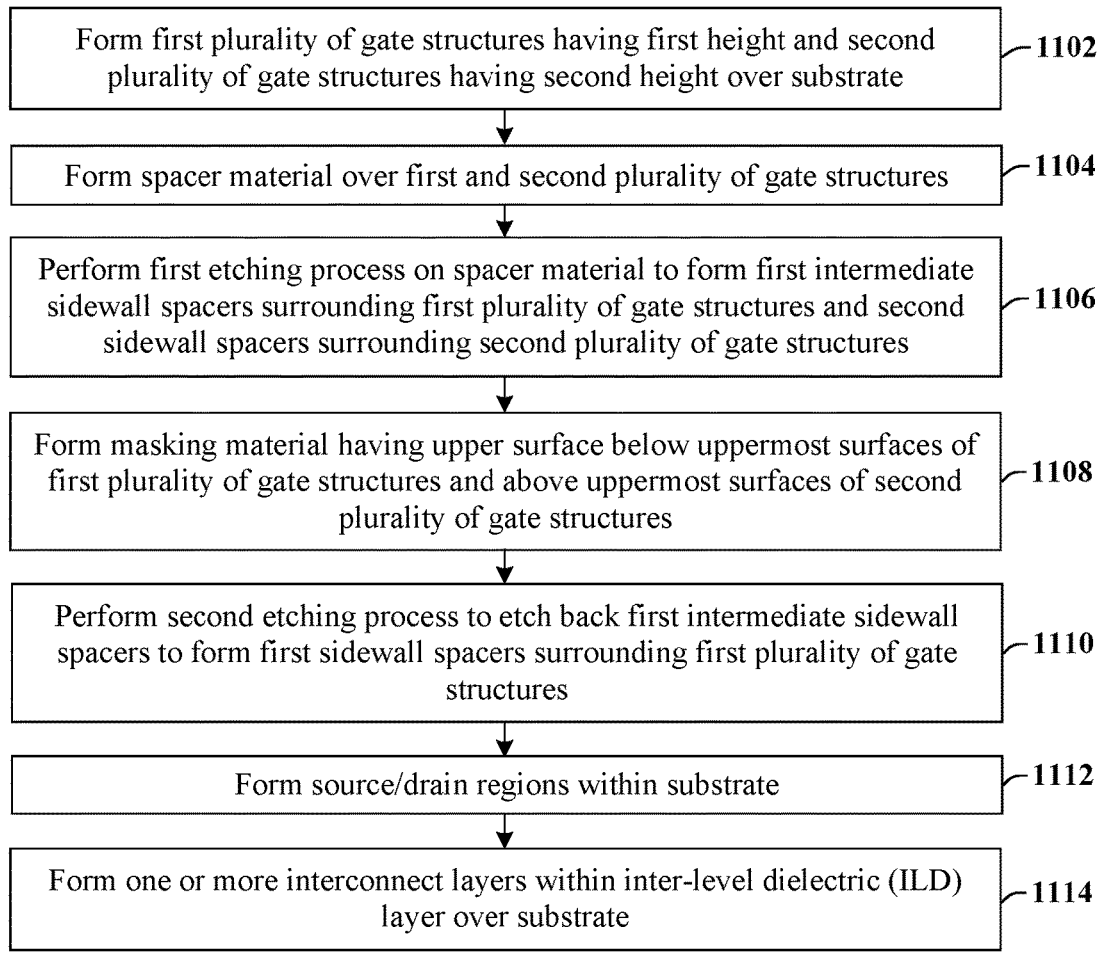
FIG. 11 illustrate some embodiments of a flow diagram of a method of forming an integrated chip having sidewall spacers configured to improve dielectric fill between adjacent gate structures.

FIG. 11 illustrate some embodiments of a flow diagram of a method 1100 of forming an integrated chip having sidewall spacers configured to improve dielectric fill between adjacent gate structures.

While method 1100 is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 1102, a first plurality of gate structures having first height and second plurality of gate structures having second heights are formed over a substrate. In some embodiments, the first plurality of gate structures and the second plurality of gate structures may be formed by different deposition and/or patterning processes. FIG. 4 illustrates a cross-sectional view 400 of some embodiments corresponding to act 1102.

At 1104, a spacer material is formed over the first plurality of gate structures and the second plurality of gate structures. FIG. 5 illustrates a cross-sectional view 500 of some embodiments corresponding to act 1104.

At 1106, a first etching process is performed on the spacer material to form first intermediate sidewall spacers surrounding the first plurality of gate structures and second sidewall spacers surrounding the second plurality of gate structures. FIG. 6 illustrates a cross-sectional view 600 of some embodiments corresponding to act 1106.

At 1108, a masking material is formed over the substrate. The masking material has an upper surface below uppermost surfaces of the first plurality of gate structures and above uppermost surfaces of the second plurality of gate structures. FIG. 7 illustrates a cross-sectional view 700 of some embodiments corresponding to act 1108.

At 1110, a second etching process is performed to etch back the first intermediate sidewall spacers surrounding the first plurality of gate structures. Etching back the first intermediate sidewall spacers forms first sidewall spacers surrounding the first plurality of gate structures. FIG. 8 illustrates a cross-sectional view 800 of some embodiments corresponding to act 1110.

At 1112, source/drain regions are formed within the substrate. FIG. 9 illustrates a cross-sectional view 900 of some embodiments corresponding to act 1112.

At 1114, one or more interconnect layers are formed within an inter-level dielectric (ILD) layer over the substrate. FIG. 10 illustrates a cross-sectional view 1000 of some embodiments corresponding to act 1114.

Accordingly, the present disclosure relates to a method of forming sidewall spacers that are configured to improve dielectric fill between adjacent gate structures, and an associated apparatus.

In some embodiments, the present disclosure relates to a method of forming an integrated chip. The method includes forming a first gate structure and a second gate structure over a substrate; forming a sidewall spacer material over the first gate structure and over the second gate structure; performing a first etching process on the sidewall spacer material to form a first intermediate sidewall spacer surrounding the first gate structure and to form a second sidewall spacer surrounding the second gate structure; forming a masking material over the substrate, a part of the first intermediate sidewall spacer protrudes outward from the masking material and the second sidewall spacer is completely covered by the masking material; and performing a second etching process on the part of the first intermediate sidewall spacer that protrudes outward from the masking material to form a first sidewall spacer recessed below a first uppermost surface of the first gate structure. In some embodiments, a top of the first sidewall spacer is arranged along a horizontal plane between the first uppermost surface and a second uppermost surface of the second gate structure. In some embodiments, the first sidewall spacer has a first cross-sectional profile that is a different shape and size than a second cross-sectional profile of the second sidewall spacer. In some embodiments, the first sidewall spacer has a first lower region and a first upper region that has a first angled sidewall that causes a width of the first sidewall spacer to monotonically decrease; and the second sidewall spacer has second lower region and a second upper region that has a second angled sidewall that causes a width of the second sidewall spacer to monotonically decrease. In some embodiments, the first sidewall spacer has a ledge extending between the first lower region and the first upper region. In some embodiments, the method further includes forming a contact etch stop layer over the substrate, the contact etch stop layer is separated from the first gate structure by the first sidewall spacer and further separated from the second gate structure by the second sidewall spacer. In some embodiments, the contact etch stop layer contacts sidewalls of the first sidewall spacer and sidewalls of the first gate structure. In some embodiments, the first gate structure and the second gate structure are formed by different deposition and patterning processes. In some embodiments, the first sidewall spacer is recessed below the first uppermost surface by a distance in a range of between approximately 10 nm and approximately 20 nm.

In other embodiments, the present disclosure relates to a method of forming an integrated chip. The method includes depositing a sidewall spacer material over a first plurality of gate structures and over a second plurality of gate structures over a substrate; performing a first etching process on the sidewall spacer material to form first intermediate sidewall spacers surrounding the first plurality of gate structures and to form second sidewall spacers surrounding the second plurality of gate structures; forming a photoresist layer over the substrate, the photoresist layer has an upper surface below tops of the first intermediate sidewall spacers and above tops of the second sidewall spacers; and performing a second etching process, with the photoresist layer over the substrate, to remove parts of the first intermediate sidewall spacers and form first sidewall spacers recessed below uppermost surfaces of the first plurality of gate structures. In some embodiments, the method further includes forming a source/drain region between adjacent ones of the first plurality of gate structures; forming an inter-level dielectric layer between the first sidewall spacers and the second sidewall spacers; etching the inter-level dielectric layer to form a contact hole over the source/drain region, the contact hole extends between adjacent ones of the first sidewall spacers; and depositing a conductive material within the contact hole. In some embodiments, the first sidewall spacers respectively have a ledge extending between a lower sidewall and an overlying upper sidewall. In some embodiments, forming the first plurality of gate structures includes forming a tunnel dielectric film over the substrate; forming a floating gate electrode film over the tunnel dielectric film; forming an inter-electrode dielectric film over the floating gate electrode film; forming a control gate electrode film over the inter-electrode dielectric film; and selectively patterning the tunnel dielectric film, the floating gate electrode film, the inter-electrode dielectric film, and the control gate electrode film according to a first etching process. In some embodiments, forming the second plurality of gate structures includes forming a gate dielectric film over the substrate; forming a gate electrode film over the gate dielectric film; and selectively patterning the gate dielectric film and the gate electrode film according to a second etching process separate from the first etching process.

In yet other embodiments, the present disclosure relates to an integrated chip. The integrated chip includes a first gate structure over a substrate and having a first height between the substrate and a first uppermost surface of the first gate structure; a second gate structure over the substrate and having a second height between the substrate and a second uppermost surface of the second gate structure, the second height is smaller than the first height; a first sidewall spacer surrounding the first gate structure and recessed below the first uppermost surface; and a second sidewall spacer surrounding the second gate structure and having outermost sidewalls separated from outermost sidewalls of the first sidewall spacer, a top of the first sidewall spacer is arranged along a horizontal plane that is between the first uppermost surface and the second uppermost surface. In some embodiments, second sidewall spacer has a height that is substantially equal to the second height. In some embodiments, the first sidewall spacer has a first cross-sectional profile that has a different shape and size than a second cross-sectional profile of the second sidewall spacer. In some embodiments, the first sidewall spacer has a first lower region and a first upper region that has a first angled sidewall that causes a width of the first sidewall spacer to monotonically decrease; and the second sidewall spacer has second lower region and a second upper region that has a second angled sidewall that causes a width of the second sidewall spacer to monotonically decrease. In some embodiments, a first line extending between ends of the first angled sidewall has a first slope that is greater than a second slope of a second line extending between ends of the second angled sidewall. In some embodiments, the first gate structure comprises a floating gate separated from the substrate by a tunnel dielectric and a control gate separated from the floating gate by an inter-level dielectric; and the second gate structure comprises a gate electrode separated from the substrate by a gate dielectric.

In yet other embodiments, the present disclosure relates to an integrated chip. The integrated chip includes a first gate structure over a substrate and having a first uppermost surface; a second gate structure over the substrate and having a second uppermost surface; and a first sidewall spacer surrounding the first gate structure, a top of the first sidewall spacer is arranged along a horizontal plane that is below the first uppermost surface and that is above the second uppermost surface. In some embodiments, the integrated chip further includes a second sidewall spacer surrounding the second gate structure and extending to the second uppermost surface, the first sidewall spacer has outermost sidewalls separated from outermost sidewalls of the second sidewall spacer. In some embodiments, the integrated chip further includes a second sidewall spacer surrounding the second gate structure, the first sidewall spacer has a top that is recessed below the first uppermost surface by a first distance and the second sidewall spacer has a top that is recessed below the second uppermost surface by a second distance smaller than the first distance. In some embodiments, the second distance is substantially equal to zero. In some embodiments, the first sidewall spacer has a first lower region and a first upper region having a first angled sidewall that causes a width of the first sidewall spacer to monotonically decrease; and the second sidewall spacer has second lower region and a second upper region having a second angled sidewall that causes a width of the second sidewall spacer to monotonically decrease. In some embodiments, the first sidewall spacer has a ledge extending between the first lower region and the first upper region. In some embodiments, the first gate structure comprises a polysilicon floating gate electrode separated from the substrate by a tunnel dielectric and a polysilicon control gate electrode separated from the polysilicon floating gate electrode by an inter-level dielectric; and the second gate structure comprises a metal gate electrode separated from the substrate by a gate dielectric. In some embodiments, the polysilicon control gate electrode of the first gate structure protrudes outward from between interior sidewalls of the first sidewall spacer. In some embodiments, the first sidewall spacer is recessed below the first uppermost surface by a distance in a range of between approximately 5 nm and approximately 25 nm. In some embodiments, the integrated chip further includes a contact etch stop layer separated from the first gate structure by the first sidewall spacer. In some embodiments, the contact etch stop layer contacts sidewalls of the first sidewall spacer and sidewalls of the first gate structure.

In yet other embodiments, the present disclosure relates to an integrated chip. The integrated chip includes a first gate structure over a substrate and having a first uppermost surface; a first sidewall spacer having a first lower region and a first upper region surrounding the first gate structure, a top of the first sidewall spacer is arranged along a horizontal plane that is below the first uppermost surface; and the first upper region has a first angled sidewall that causes a width of the first sidewall spacer to monotonically decrease as a height of the first upper region increases. In some embodiments, the first sidewall spacer has a ledge extending between the first lower region and the first upper region. In some embodiments, the integrated chip further includes a second gate structure over the substrate and having a second uppermost surface, wherein the horizontal plane is above the second uppermost surface. In some embodiments, the first gate structure comprises a floating gate separated from the substrate by a tunnel dielectric and a control gate separated from the floating gate by an inter-level dielectric. In some embodiments, the first angled sidewall has a linear segment.

In other embodiments, the present disclosure relates to a method of forming an integrated chip. The method includes forming a first gate structure over a substrate; depositing a sidewall spacer material over the first gate structure; performing a first etching process on the sidewall spacer material to form a first intermediate sidewall spacer surrounding the first gate structure; forming a masking material over the substrate, a part of the first intermediate sidewall spacer protrudes outward from the masking material to a location over the masking material; and performing a second etching process on the part of the first intermediate sidewall spacer that protrudes from the masking material to form a first sidewall spacer recessed below a first uppermost surface of the first gate structure. In some embodiments, the second etching process changes a curvature of a sidewall of the first intermediate sidewall spacer, so that the first intermediate sidewall spacer has a second cross-sectional profile with a different shape and size than a first cross-sectional profile of the first sidewall spacer. In some embodiments, the method further includes forming a second gate structure over the substrate; depositing the sidewall spacer material over the second gate structure; performing the first etching process on the sidewall spacer material to form a second sidewall spacer surrounding the second gate structure; and forming the masking material over a top of the second sidewall spacer. In some embodiments, a top of the first sidewall spacer is arranged along a horizontal plane between the first uppermost surface and a second uppermost surface of the second gate structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated chip, comprising:
a first gate structure disposed over a substrate and having a first height measured between an upper surface of the substrate and a first uppermost surface of the first gate structure;
a second gate structure disposed over the substrate and having a second height measured between the upper surface of the substrate and a second uppermost surface of the second gate structure, wherein the second height is smaller than the first height;
a first sidewall spacer laterally surrounding the first gate structure and recessed below the first uppermost surface;
a second sidewall spacer laterally surrounding the second gate structure, wherein the second sidewall spacer has a third height that is substantially equal to the second height; and
wherein a top of the first sidewall spacer is arranged along a horizontal plane that is vertically between the first uppermost surface and the second uppermost surface.

2. The integrated chip of claim 1, wherein the first sidewall spacer has a fourth height that is larger than the third height of the second sidewall spacer.

3. The integrated chip of claim 1, wherein the first sidewall spacer has a first cross-sectional profile that has a different shape and a different size than a second cross-sectional profile of the second sidewall spacer.

4. The integrated chip of claim 1, wherein the first sidewall spacer has a lower sidewall and an upper sidewall, which are coupled to opposing sides of a horizontally extending ledge of the first sidewall spacer.

5. The integrated chip of claim 1, further comprising:
an etch stop layer having one or more sidewalls that directly contact an outermost sidewall of the first sidewall spacer and sides of the first gate structure.

6. The integrated chip of claim 1, further comprising:
an etch stop layer having a sidewall that contacts the second sidewall spacer, wherein the etch stop layer is completely laterally separated from the second gate structure by the second sidewall spacer.

7. The integrated chip of claim 1, wherein a line that is tangent to an outermost sidewall of the first sidewall spacer intersects a sidewall of the first gate structure at a location that is a non-zero distance below a top of the first gate structure.

8. The integrated chip of claim 1, wherein the first gate structure comprises a floating gate separated from the substrate by a tunnel dielectric and a control gate separated from the floating gate by an inter-electrode dielectric.

9. The integrated chip of claim 8, wherein the top of the first sidewall spacer is vertically between a bottom of the control gate and a top of the control gate.

10. The integrated chip of claim 8, wherein the second gate structure comprises a gate electrode separated from the substrate by a gate dielectric.

11. An integrated chip, comprising:
a first gate structure disposed over a substrate and laterally surrounded by a first sidewall spacer, wherein the first gate structure protrudes outward from a top of the first sidewall spacer;
a second gate structure over the substrate and laterally surrounded by a second sidewall spacer, wherein the second sidewall spacer has an inner surface that faces the second gate structure and that meets an angled outer surface of the second sidewall spacer at a top of the second sidewall spacer, an acute angle extends from the angled outer surface to the inner surface;
a third gate structure disposed over the substrate between the first gate structure and the second gate structure and laterally surrounded by a third sidewall spacer, wherein the third gate structure protrudes outward from a top of the third sidewall spacer; and
wherein the first gate structure has a first height that is larger than a second height of the second gate structure and the third gate structure has a third height that is larger than the second height.

12. The integrated chip of claim 11, wherein the first sidewall spacer has a fourth height that is larger than a fifth height of the second sidewall spacer.

13. The integrated chip of claim 12, wherein the fourth height is smaller than the first height and larger than the second height.

14. The integrated chip of claim 11, wherein the first sidewall spacer has a first cross-sectional profile that has a different shape and a different size than a second cross-sectional profile of the second sidewall spacer.

15. The integrated chip of claim 11, wherein the first sidewall spacer and the third sidewall spacer have substantially linear segments disposed along lines that intersect to define a "V" shape as viewed in a cross-sectional view.

16. The integrated chip of claim 11, wherein the second sidewall spacer is tapered to a point at the top of the second sidewall spacer.

17. An integrated chip, comprising:
a flash gate structure disposed over a substrate and laterally surrounded by a first sidewall spacer, wherein the flash gate structure comprises a floating gate separated from the substrate by a tunnel dielectric and a control gate separated from the floating gate by an inter-electrode dielectric, the control gate extending from directly between sidewalls of the first sidewall spacer to vertically over a top of the first sidewall spacer;
a logic gate structure disposed over the substrate and laterally surrounded by a second sidewall spacer having a smaller height than the first sidewall spacer; and
wherein the first sidewall spacer has an outer sidewall with a first curvature that is smaller than a second curvature of an outer sidewall of the second sidewall spacer.

18. The integrated chip of claim 17, wherein the first sidewall spacer has a first height that is larger than a third height of the logic gate structure.

19. The integrated chip of claim 17, further comprising:
an etch stop layer having a curved surface that contacts the first sidewall spacer and a substantially flat surface that contacts a sidewall of the flash gate structure.

20. The integrated chip of claim 17, wherein the first curvature deviates from a first plane by a first amount and the second curvature deviates from a second plane by a second amount that is larger than the first amount.

* * * * *